US008190967B2

(12) United States Patent
Hong et al.

(10) Patent No.: US 8,190,967 B2
(45) Date of Patent: May 29, 2012

(54) PARITY CHECK MATRIX STORING METHOD, BLOCK LDPC CODING METHOD, AND APPARATUS USING PARITY CHECK MATRIX STORING METHOD

(75) Inventors: Eon-Young Hong, Daejeon (KR); Jung-Pil Choi, Daejeon (KR); Youn-Ok Park, Daejeon (KR)

(73) Assignees: Samsung Electronics Co., Ltd., Suwon-si (KR); Electronics and Telecommunications Research Institute, Daejeon (KR)

(*) Notice: Subject to any disclaimer, the term of this patent is extended or adjusted under 35 U.S.C. 154(b) by 1280 days.

(21) Appl. No.: 11/861,884

(22) Filed: Sep. 26, 2007

(65) Prior Publication Data
US 2008/0140686 A1   Jun. 12, 2008

(30) Foreign Application Priority Data
Dec. 8, 2006   (KR) .............................. 2006-124575

(51) Int. Cl.
*H03M 13/11*   (2006.01)
*H03M 13/33*   (2006.01)
(52) U.S. Cl. ........................................ 714/758; 714/800
(58) Field of Classification Search .................. None
See application file for complete search history.

(56) References Cited

U.S. PATENT DOCUMENTS

| 6,049,793 A * | 4/2000 | Tomita ............................. 706/17 |
| 7,234,098 B2 | 6/2007 | Eroz et al. |
| 2004/0148560 A1 * | 7/2004 | Hocevar ......................... 714/801 |
| 2005/0149840 A1 | 7/2005 | Lee et al. |
| 2006/0036926 A1 * | 2/2006 | Hocevar ......................... 714/758 |

FOREIGN PATENT DOCUMENTS

| JP | 2003-188737 A | 7/2003 |
| JP | 2005-136990 A | 5/2005 |
| JP | 2006-100941 A | 4/2006 |
| KR | 10-0550101 B1 | 2/2006 |

* cited by examiner

*Primary Examiner* — Jeffrey A Gaffin
*Assistant Examiner* — Dipakkumar Gandhi
(74) *Attorney, Agent, or Firm* — Jefferson IP Law, LLP

(57) ABSTRACT

The present invention relates to a low density parity check (LDPC) encoding method and an apparatus thereof. In the LDPC encoding method, a matrix multiplication corresponding to $ET^{-1}$ and $T^{-1}$ is eliminated according to a structural characteristic in an encoding process. Accordingly, shift weights that are not −1 among shift weights corresponding to partial blocks A, B, and C of a parity check matrix are used to perform an encoding operation, and a cyclic shift operation of an information unit block is performed in parallel so that a first parity block and a second parity block may be simultaneously generated.

16 Claims, 15 Drawing Sheets

$$H = \begin{pmatrix} 1 & 1 & 1 & 1 & 1 & 1 & 1 & 1 \\ 1 & 1 & 1 & 1 & 1 & 1 & 1 & 1 \\ 0 & 0 & 0 & 0 & 0 & 0 & 0 & 0 \\ 0 & 0 & 0 & 0 & 0 & 0 & 0 & 0 \end{pmatrix}$$

FIG.3

$$H = \begin{pmatrix} w_{0,0} & w_{0,0} & w_{0,0} & \cdots & w_{0,n_b-2} & w_{0,n_b-1} \\ w_{1,0} & w_{1,0} & w_{1,0} & \cdots & w_{1,n_b-2} & w_{1,n_b-1} \\ w_{2,0} & w_{2,0} & w_{2,0} & \cdots & w_{2,n_b-2} & w_{2,n_b-1} \\ \vdots & \vdots & \vdots & \vdots & \vdots & \vdots \\ w_{m_b-1,0} & w_{m_b-1,1} & w_{m_b-1,2} & & w_{m_b-1,n_b-2} & w_{m_b-1,n_b-1} \end{pmatrix} = w^{H_b}$$

FIG.4

$$H_b = \left[ (H_{b1})_{m_b \times k_b} \mid (H_{b2})_{m_b \times m_b} \right]$$

FIG.5

$$H_{b2} = \begin{bmatrix} h_b(0) & : & 1 & 0 & 0 & 0 & 0 \\ h_b(1) & & 1 & 1 & 0 & 0 & 0 \\ & & 0 & 1 & \ddots & 0 & 0 \\ \vdots & : & 0 & 0 & \ddots & 1 & 0 \\ & & 0 & 0 & 0 & 1 & 1 \\ h_b(m_b-1) & : & 0 & 0 & 0 & 0 & 1 \end{bmatrix}$$

| i | j | $a_{i,j}$ | j | $a_{i,j}$ | j | $a_{i,j}$ | j | $a_{i,j}$ | j | $a_{i,j}$ |
|---|---|---|---|---|---|---|---|---|---|---|
| 0 | 1 | 23 | 2 | 18 | 8 | 13 | 9 | 20 | -1 | -1 |
| 1 | 1 | 6 | 5 | 5 | 6 | 19 | 7 | 2 | 11 | 3 |
| 2 | 3 | 6 | 4 | 5 | 5 | 20 | 7 | 8 | 11 | 0 |
| 3 | 0 | 15 | 2 | 11 | 8 | 16 | 9 | 6 | -1 | -1 |
| 4 | 2 | 9 | 6 | 21 | 9 | 10 | 10 | 18 | -1 | -1 |
| 5 | 4 | 11 | 5 | 10 | 7 | 20 | 11 | 19 | -1 | -1 |
| 6 | 2 | 23 | 3 | 13 | 9 | 3 | 10 | 4 | -1 | -1 |
| 7 | 1 | 2 | 2 | 18 | 6 | 0 | 9 | 11 | -1 | -1 |
| 8 | 0 | 3 | 4 | 20 | 5 | 6 | 7 | 10 | 11 | 12 |
| 9 | 5 | 23 | 7 | 14 | 10 | 17 | 11 | 18 | -1 | -1 |
| 10 | 2 | 1 | 3 | 16 | 8 | 9 | 9 | 12 | -1 | -1 |

FIG.10

| j | 0 | 5 | 7 | 11 |
|---|---|---|---|---|
| $a_{i,j}$ | 10 | 16 | 10 | 6 |

FIG.11

| i | 0 | 5 |
|---|---|---|
| $a_{i,j}$ | 1 | 0 |

PARITY CHECK MATRIX STORING METHOD, BLOCK LDPC CODING METHOD, AND APPARATUS USING PARITY CHECK MATRIX STORING METHOD

CROSS-REFERENCE TO RELATED APPLICATION

This application claims priority to and the benefit of Korean Patent Application No. 10-2006-0124575 filed in the Korean Intellectual Property Office on Dec. 8, 2006, the entire contents of which are incorporated herein by reference.

BACKGROUND OF THE INVENTION (a) Field of the Invention

The present invention relates to a low density parity check (LDPC) encoding method. More particularly, the present invention relates to a block LDPC encoding method and an apparatus thereof.

(b) Description of the Related Art

As mobile communication systems develop, the need to develop techniques for efficiently transmitting large capacity data in a wired/wireless network is increasing. Accordingly, in the mobile communication system, an error-control code is used as a method for improving system performance by efficiently reducing data loss caused by noise, interference, or a fading effect in a channel.

For the error-control code, a turbo code and an LDPC code are widely used. The LDPC code may be appropriately used since performance of the LDPC code is similar to that of the turbo code, it has lower complexity than that of the turbo code, and it is easy to parallelize. In addition, excellent performance to the Shannon limit may be achieved when a code length increases, which has been actively studied to be applied to a next generation mobile communication system.

A basic configuration of the LDPC code is defined by a parity check matrix. The parity check matrix is defined as a sparse configuration in which many elements of the parity check matrix respectively have a 0 value, and remaining elements thereof have non-zero values. An (N,j,k) LDPC code is a linear block code, which has a block length of N, j elements having non-zero values for each column and k elements having values of 1 for each row.

In this case, the number of elements having non-zero values for each column or each row in the parity check matrix is referred to as a weight, an LDPC code having regular weights of each column and each row is referred to as a regular LDPC code, and an LDPC code having irregular weights of each column and each row is referred to as an irregular LDPC code. Generally, the irregular LDPC code has better performance compared to the regular LDPC code. However, in the irregular LDPC code, since the parity check matrix has irregular weights of each column and each row, the weights are required to be appropriately adjusted to guarantee excellent performance.

FIG. 1 is a diagram representing a parity check matrix of a conventional LDPC code, and FIG. 2 is a factor graph of the LDPC code using the parity check matrix shown in FIG. 1.

As shown in FIG. 1, a parity check matrix H of an (8, 2, 4) LDPC code is used to decode the LDPC code, the parity check matrix H includes 8 columns and 4 rows, and weights are regularly formed such that a weight of each column is 2 and a weight of each row is 4. Since the weights are regularly formed for each column and each row in the parity check matrix, the (8, 2, 4) LDPC code shown in FIG. 1 is the regular LDPC code.

FIG. 2 is a diagram representing a factor graph of the (8, 2, 4) LDPC code.

Referring to FIG. 2, the factor graph of the (8, 2, 4) LDPC code includes 8 variable nodes (x1, x2, x3, x4, x5, x6, x7, and x8) and 4 check nodes (s16, s18, s10, and s12). Performance of the LDPC code increases as the number of edges that connect the variable nodes and the check nodes increases. Since it is required to calculate a generator matrix G from the parity check matrix to perform an encoding operation, it is difficult to generate the generator matrix when the code length increases and the size of the parity check matrix increases.

To solve the above problem, a block LDPC code has been developed to efficiently perform the encoding operation of the LDPC code without reducing performance. In the block LDPC code, the generator matrix is not calculated in the parity check matrix, the parity check matrix is appropriately divided, and the encoding operation is directly performed by using the divided matrix.

FIG. 3 is a diagram representing the parity check matrix of a conventional block LDPC code, and FIG. 4 and FIG. 5 are diagrams representing superscript matrixes of a partial matrix of the parity check matrix of the block LDPC code shown in FIG. 3.

In the block LDPC code, an efficient encoding operation, an efficient operation for storing the parity check matrix, and performance improvement are considered.

As shown in FIG. 3, in the parity check matrix H that is the block LDPC code, the entire parity check matrix is divided into a plurality of partial blocks, and permutation matrixes correspond to respective divided blocks.

Hereinafter, the permutation matrix corresponding to the partial matrix will be referred to as a "partial matrix". w denotes a permutation matrix having a size of z×z, it is a zero matrix when a value thereof is −1, and it is an unitary matrix having the size of z×z when the value thereof is 0. When the value is a number that is greater than 0, the unitary matrix having the size of z×z is cyclically shifted by the value to form the permutation matrix. A superscript $H_b$ of the permutation matrix w is given as shown in FIG. 4 and FIG. 5.

In addition, $m_b$ indicates that the corresponding permutation matrix is positioned in an $m_b{}^{th}$ row among the plurality of partial blocks of the parity check matrix, and $n_b$ indicates that the corresponding permutation matrix is positioned in an $n_b{}^{th}$ column among the plurality of partial blocks of the parity check matrix. That is, $Wm_b n_b$ indicates a permutation matrix positioned in a partial block at a crossing region of the $m_b{}^{th}$ row and $n_b{}^{th}$ column of the parity check matrix including the plurality of partial blocks.

In addition, since the number of all rows is $z \times m_b$ and the number of all columns is $z \times n_b$ in the entire parity check matrix of the LDPC code shown in FIG. 3, when the entire parity check matrix of the block LDPC code has a full rank, a coding rate may be shown as Equation 1 regardless of the size of the partial blocks.

$$R = \frac{z \times n_b - z \times m_b}{z \times n_b} = \frac{n_b - m_b}{n_b} = 1 - \frac{m_b}{n_b} \qquad \text{[Equation 1]}$$

The entire LDPC parity check matrix has a size of $z(m_b \times n_b)$. However, the entire LDPC parity check matrix may be expressed by using $m_b \times n_b$ superscripts, and therefore the size of a memory for storing all parity check matrix information is reduced to be 1/z.

In addition, the LDPC parity check matrix has a unique configuration to perform an efficient encoding operation. The LDPC code is used to generate a parity check bit having a size of $z \times n_b - z \times m_b$ based on input data formed in an information block type having a length of $z \times m_b$, and the entire codeword has a size of $z \times n_b$ formed by adding a parity check block to the information block, and is transmitted.

FIG. 6 is a diagram representing the codeword of the block LDPC code divided into partial blocks including an information block u, a first parity block p1, and a second parity block p2.

Here, the information block is a part of the parity check matrix mapped to actual information in a process for encoding the block LDPC code. In addition, the first and second parity blocks are a part of the parity check matrix mapped to an actual parity in the operation for encoding the block LDPC code, and are formed by dividing a parity part into two parts.

FIG. 7 is a diagram representing 6 partial blocks divided from the parity check matrix according to a structural characteristic of the block LDPC code.

Referring to FIG. 7, the parity check matrix of the block LDPC code shown in FIG. 6 is divided into an information part and a parity part, and it includes a partial block A and partial block C included in the information part, a partial block B and a partial block D included in a first parity part, and a partial block T and a partial block E included in a second parity part. Here, the information part is a part of the party check matrix to which an actual information vector (an information block) is mapped in the process for encoding the block LDPC code. The parity part is a part of the parity check matrix mapped to the actual parity block in the process for encoding to the block LDPC code, and it is divided into two parts.

Relationships between the parity check matrix and codeword blocks may be given as Equation 2.

$$Au^T + Bp_1^T + Tp_2^T = 0$$

$$Cu^T + Dp_1^T + Ep_2^T = 0 \quad \text{[Equation 2]}$$

An equation for calculating a parity block as given in Equation 3 may be obtained from Equation 2.

$$p_2^T = T^{-1}(Au^T + Bp_1^T)$$

$$p_1^T = (ET^{-1}B + D)^{-1}(ET^{-1}A + C)u^T \quad \text{[Equation 3]}$$

In the block LDPC encoding operation, $ET^{-1}B + D$ is formed to be an unitary matrix, and $T^{-1}$ is easily calculated in Equation 3 so as to efficiently realize the LDPC encoding operation. Therefore, Equation 3 may be simplified as Equation 4.

$$p_2^T = T^{-1}Au^T + T^{-1}Bp_1^T$$

$$p_1^T = ET^{-1}Au^T + Cu^T \quad \text{[Equation 4]}$$

When the information block and the parity block are divided into blocks having sizes of z (hereinafter referred to as an "information unit block") as shown in FIG. 6, a product of a partial block forming the LDPC parity check matrix without 0 is a value obtained by cyclically shifting the information unit block having the size of z by a shift weight of the partial block. A product of the partial block and the information block according to the shift weight value is given as Equation 5 when z is 4. As shown in Equation 5, a value obtained by cyclically shifting the information block by the weight value is the same as a value obtained by multiplying the information block by the partial block that is cyclically shifted by the shift weight.

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix}\begin{bmatrix} u_1 \\ u_2 \\ u_3 \\ u_4 \end{bmatrix} = \begin{bmatrix} u_1 \\ u_2 \\ u_3 \\ u_4 \end{bmatrix} \quad \begin{bmatrix} 0 & 1 & 0 & 0 \\ 0 & 0 & 1 & 0 \\ 0 & 0 & 0 & 1 \\ 1 & 0 & 0 & 0 \end{bmatrix}\begin{bmatrix} u_1 \\ u_2 \\ u_3 \\ u_4 \end{bmatrix} = \begin{bmatrix} u_2 \\ u_3 \\ u_4 \\ u_1 \end{bmatrix} \quad \text{[Equation 5]}$$

$$p^0 \qquad\qquad p^1$$

$$\begin{bmatrix} 0 & 0 & 1 & 0 \\ 0 & 0 & 0 & 1 \\ 1 & 0 & 0 & 0 \\ 0 & 1 & 0 & 0 \end{bmatrix}\begin{bmatrix} u_1 \\ u_2 \\ u_3 \\ u_4 \end{bmatrix} = \begin{bmatrix} u_3 \\ u_4 \\ u_1 \\ u_2 \end{bmatrix} \quad \begin{bmatrix} 0 & 0 & 0 & 1 \\ 1 & 0 & 0 & 0 \\ 0 & 1 & 0 & 0 \\ 0 & 0 & 1 & 0 \end{bmatrix}\begin{bmatrix} u_1 \\ u_2 \\ u_3 \\ u_4 \end{bmatrix} = \begin{bmatrix} u_4 \\ u_1 \\ u_2 \\ u_3 \end{bmatrix}$$

$$p^2 \qquad\qquad p^3$$

It is well known that the above block LDPC code and the turbo code have an excellent performance gain in high-rate data transmission, and the block LDPC code has a merit in that an error caused by a noise generated in a transmission channel is efficiently corrected and reliability of data transmission may be increased. However, to process high-capacity data including high quality motion picture data in real time in a developed mobile communication system, it is required to minimize complexity so that the high capacity data may be quickly processed in the conventional LDPC encoding operation. In addition, it is required to reduce capacity of a memory required to realize the conventional block LDPC encoding operation, to reduce hardware complexity and to reduce manufacturing cost.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a low density parity check (LDPC) encoding method and an apparatus for minimizing complexity so as to process high capacity data at a high speed. In addition, the present invention has been made in an effort to provide an LDPC encoding method and an apparatus for reducing memories required to realize block LDPC encoding and improving hardware complexity.

According to an exemplary embodiment of the present invention, in a method for storing a parity check matrix of a block low density parity check code, shift weights of the parity check matrix are classified for each partial block, and shift weights corresponding to a partial block A, a partial block B, and a partial block C among the parity check matrix are stored.

According to another exemplary embodiment of the present invention, in a block low density parity check encoding method, an information unit block included in an information block by using partial blocks A and C that are divided from a parity check matrix according to a structural characteristic of a block low density parity check code is cyclically shifted, cyclically shifted results are accumulatively added to generate at least one parity partial block corresponding to the partial block A and a first parity block corresponding to the partial blocks A and C, a cyclically shifting result of the first parity block is added to the parity partial block in correspondence to a shift weight of the partial block B, a second parity block is generated by arranging the adding results, and the information block, the first parity block, and the second parity block are combined to generate a codeword.

An exemplary block low density parity check encoding device according to an embodiment of the present invention includes a first memory, a first encoder, a second encoder, and a combination unit. The first memory classifies shift weights of a parity check matrix of a block low density parity check code for each of the partial blocks that are divided from the parity check matrix according to structural characteristics of the block low density parity check code, and stores the shift weights. The first encoder cyclically shifts and accumulatively adds information unit blocks by using shift weights of partial blocks A and C read from the first memory and outputs at least one parity partial block and the first parity block. Here, the information unit block is formed by dividing an information block into predetermined sizes. The second encoder adds and arranges cyclic shift results of the first parity block and the parity partial block by using a shift weight corresponding to the partial block read from the first memory, and outputs a second parity block. The combination unit combines the information unit block, the first parity block received from the first encoder, and the second parity block received from the second encoder, and outputs a codeword.

BRIEF DESCRIPTION OF THE DRAWINGS

FIG. 3 is a diagram representing the parity check matrix of the conventional block LDPC code.

FIG. 4 and FIG. 5 are diagrams representing superscript matrixes of a partial matrix of the parity check matrix of the block LDPC code shown in FIG. 3.

FIG. 8 is a diagram representing an example of a shift weight value of the parity check matrix according to an exemplary embodiment of the present invention.

FIG. 9 is a diagram representing an example of a shift weight corresponding to a partial block A that is stored in a memory according to the exemplary embodiment of the present invention.

FIG. 10 is a diagram representing an example of a shift weight corresponding to the partial block C that is stored in the memory according to the exemplary embodiment of the present invention.

FIG. 11 is a diagram representing an example of a shift weight corresponding to the partial block B that is stored in the memory according to the exemplary embodiment of the present invention.

DETAILED DESCRIPTION OF THE EMBODIMENTS

Figures 1, 2:
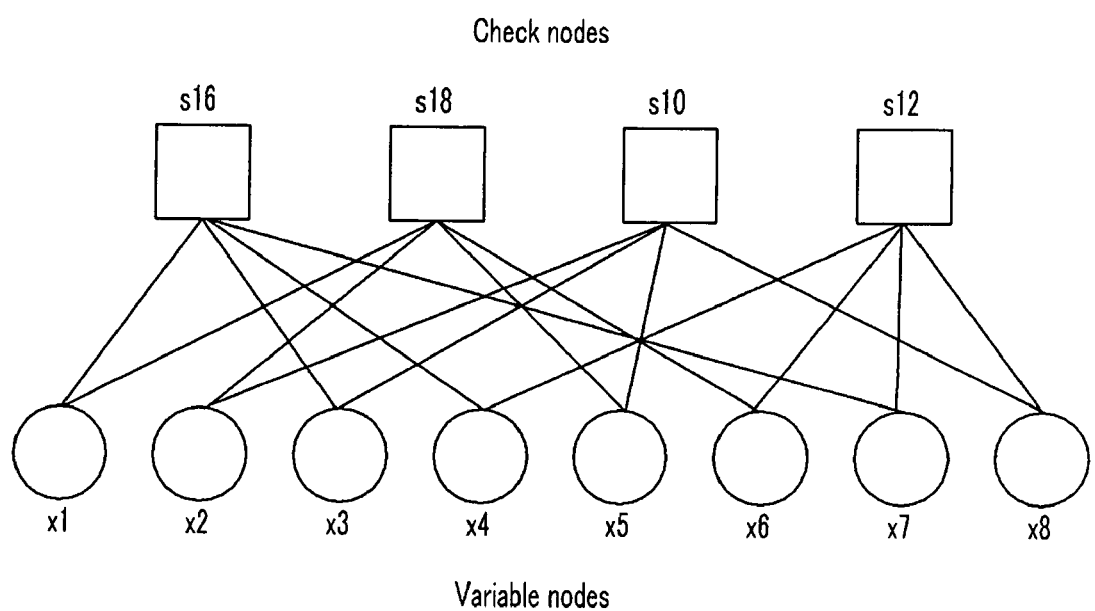
FIG. 1 is a diagram representing a parity check matrix of a conventional low density parity check (LDPC) code.
FIG. 2 is a factor graph of the LDPC code using the parity check matrix shown in FIG. 1.
Figure 6:
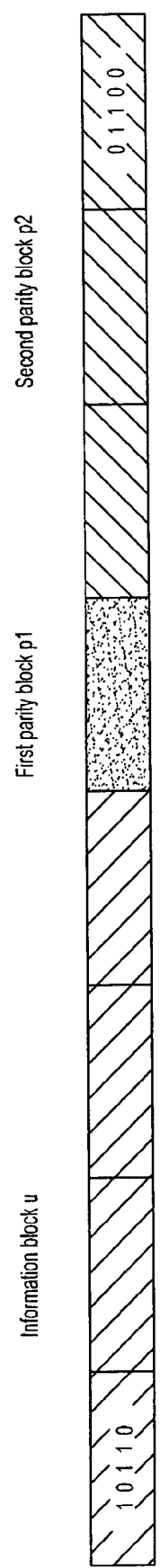
FIG. 6 is a diagram representing a codeword of the block LDPC code divided into partial blocks including an information block, a first parity block, and a second parity block.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, unless explicitly described to the contrary, the word "comprise" and variations such as "comprises" or "comprising" will be understood to imply the inclusion of stated elements but not the exclusion of any other elements.

A storing method of a parity check matrix of a block low density parity check (LDPC) code according to an exemplary embodiment of the present invention, and a block LDPC encoding method and device, will now be described. Particularly, a variable length block LDPC encoding method and device will be described with reference to the figures.

In the exemplary embodiment of the present invention, a parity check matrix of IEEE 802.16e will be exemplified as a parity check matrix of the variable length block LDPC encoding method. In addition, the parity check matrix may be differently suggested according to an encoding rate, and encoding rates of ½, ⅔, ¾, and ⅚ will be used in the exemplary embodiment of the present invention.

Firstly, a T matrix shown in Equation 4 is formed in a dual-diagonal matrix to easily obtain an inverse matrix of the T matrix, so as to store the parity check matrix in a memory. In this case, the inverse matrix of the dual-diagonal matrix is a lower triangular matrix. In addition, an E matrix is formed such that only a last partial matrix is an unitary matrix rather than a zero matrix. Accordingly, $ET^{-1}$ includes $(n_b-m_b-1)$ partial matrixes, and these partial matrixes are unitary matrixes.

A first parity block generated as above may be expressed as Equation 6.

$$P_1^T = \begin{bmatrix} w_1^0 & \cdots & w_{m_b}^0 \end{bmatrix}$$

[Equation 6]

$$\begin{bmatrix} w_{1,1}^{a_{1,1}} & w_{1,2}^{a_{1,2}} & \cdots & w_{1,m_b}^{a_{1,m_b}} \\ w_{2,1}^{a_{2,1}} & w_{2,2}^{a_{2,2}} & \cdots & w_{2,m_b}^{a_{2,m_b}} \\ \vdots & \vdots & \ddots & \vdots \\ w_{m_b\ldots1,1}^{a_{m_b\ldots1,1}} & w_{m_b\ldots1,2}^{a_{m_b\ldots1,2}} & \cdots & w_{m_b\ldots1,m_b}^{a_{m_b\ldots1,m_b}} \end{bmatrix} \begin{bmatrix} u_1 \\ u_2 \\ \vdots \\ u_{m_b} \end{bmatrix} +$$

$$\begin{bmatrix} w_{m_b,1}^{a_{m_b,1}} & w_{m_b,2}^{a_{m_b,2}} & \cdots & w_{m_b,m_b}^{a_{m_b,m_b}} \end{bmatrix} \begin{bmatrix} u_1 \\ u_2 \\ \vdots \\ u_{m_b} \end{bmatrix}$$

$$= \left( w_{1,1}^{a_{1,1}} u_1 + w_{1,2}^{a_{1,2}} u_2 + \ldots + w_{1,m_b}^{a_{1,m_b}} u_{m_b} \right) +$$

$$\left( w_{2,1}^{a_{2,1}} u_1 + w_{2,2}^{a_{2,2}} u_2 + \ldots + w_{2,m_b}^{a_{2,m_b}} u_{m_b} \right) + \ldots +$$

$$\left( w_{m_b\ldots1,1}^{a_{m_b\ldots1,1}} u_1 + w_{m_b\ldots1,2}^{a_{m_b\ldots1,2}} u_2 + \ldots + w_{m_b\ldots1,m_b}^{a_{m_b\ldots1,m_b}} u_{m_b} \right) +$$

$$\left( w_{m_b,1}^{a_{m_b,1}} u_1 + w_{m_b,2}^{a_{m_b,2}} u_2 + \ldots + w_{m_b,m_b}^{a_{m_b,m_b}} u_{m_b} \right)$$

In Equation 6, $w_{i,j}^{\alpha_{i,j}}$ is a zero matrix having a size of (z×z) when a value of $\alpha_{i,j}$ is −1, and $w_{i,j}^{\alpha_{i,j}}$ is formed in a cyclic matrix type in which an unitary matrix is cyclically shifted when the value of $\alpha_{i,j}$ is higher than or equal to 0. In addition, Equation 6 is the same as an exclusive OR obtained by cyclically shifting all information unit blocks by weight values, and the information unit blocks correspond to parts that are not zero matrixes in each row of partial blocks A and C.

A second parity block may be calculated from a first equation of Equation 4, and a second parity block is given as Equation 7 since an inverse matrix of a T matrix is the lower triangular matrix.

$$p_{2,1} = \left( w_{1,1}^{a_{1,1}} u_1 + w_{1,2}^{a_{1,2}} u_2 + \ldots + w_{1,m_b}^{a_{1,m_b}} u_{m_b} \right) +$$

$$w_1^{a_{m_b+1,1}} p_1$$

$$p_{2,2} = \left( w_{1,1}^{a_{1,1}} u_1 + w_{1,2}^{a_{1,2}} u_2 + \ldots + w_{1,m_b}^{a_{1,m_b}} u_{m_b} \right) +$$

$$w_1^{a_{m_b+1,1}} p_1 + \left( w_{2,1}^{a_{2,1}} u_1 + w_{2,2}^{a_{2,2}} u_2 + \ldots + \right.$$

$$\left. w_{2,m_b}^{a_{2,m_b}} u_{m_b} \right) + w_2^{a_{m_b+1,2}} p_1$$

$$\vdots$$

$$p_{2,m_b-1} = \left( w_{1,1}^{a_{1,1}} u_1 + w_{1,2}^{a_{1,2}} u_2 + \ldots + w_{1,m_b}^{a_{1,m_b}} u_{m_b} \right) +$$

$$w_1^{a_{m_b+1,1}} p_1 + \left( w_{2,1}^{a_{2,1}} u_1 + w_{2,2}^{a_{2,2}} u_2 + \ldots + \right.$$

$$\left. w_{2,m_b}^{a_{2,m_b}} u_{m_b} \right) + w_2^{a_{m_b+1,2}} p_1 + \ldots +$$

$$\left( w_{m_b-1,1}^{a_{m_b-1,1}} u_1 + w_{m_b-1,2}^{a_{m_b-1,2}} u_2 + \ldots + \right.$$

$$\left. w_{m_b-1,m_b}^{a_{m_b-1,m_b}} u_{m_b} \right) + w_{m_b-1}^{a_{m_b+1,m_b-1}} p_1$$

[Equation 7]

In Equation 7, a partial block B has two weight values that are not −1. One of the two weight values is positioned in a first row of the partial block B. Accordingly, the first parity block is cyclically shifted by a shift weight of the first row of the partial block B, and exclusive ORs of values of all parity part blocks are output by cyclically shifting an information block u by a weight value for each row of the partial block A and accumulatively adding the cyclically shifted information block. In addition, among the exclusive ORs, a value that is cyclically shifted by a second shift weight is exclusive-OR that is added to exclusive ORs of a row having a weight that is not −1 to a $(m_b-1)^{th}$ row. The second parity block is obtained when all the above result values are exclusive-OR added.

In addition, since most parts of shift weights in Equation 7 are zero matrixes, the block LDPC parity check matrix may be stored as the shift weight and location information of an information unit block.

The storing method of the parity check matrix of the block LDPC code according to the exemplary embodiment of the present invention will now be described with reference to the figures.

Here, a parity check matrix established when a system is designed is used, and a method for using structural characteristics of the block LDPC code to storing the shift weight value of the established parity check matrix will now be described.

Figure 8:
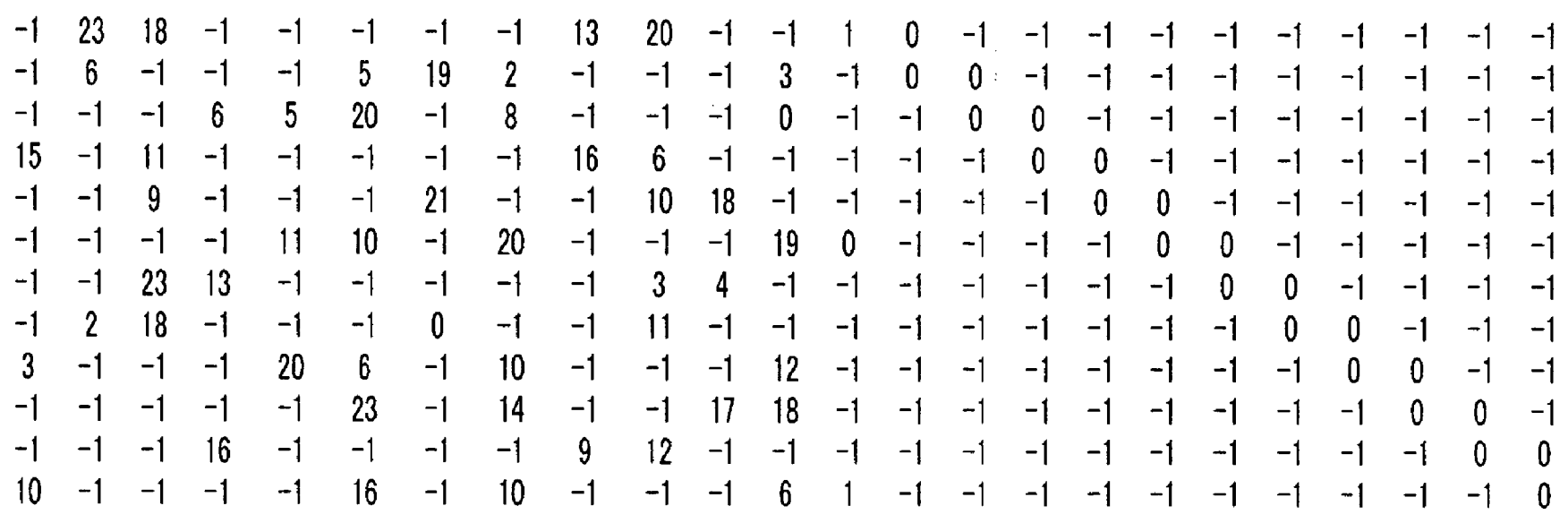

FIG. 8 is a diagram representing an example of a shift weight value of the parity check matrix according to the exemplary embodiment of the present invention. In FIG. 8, the encoding rate is ½, and the size of an information unit block is 24×24.

Figure 7:
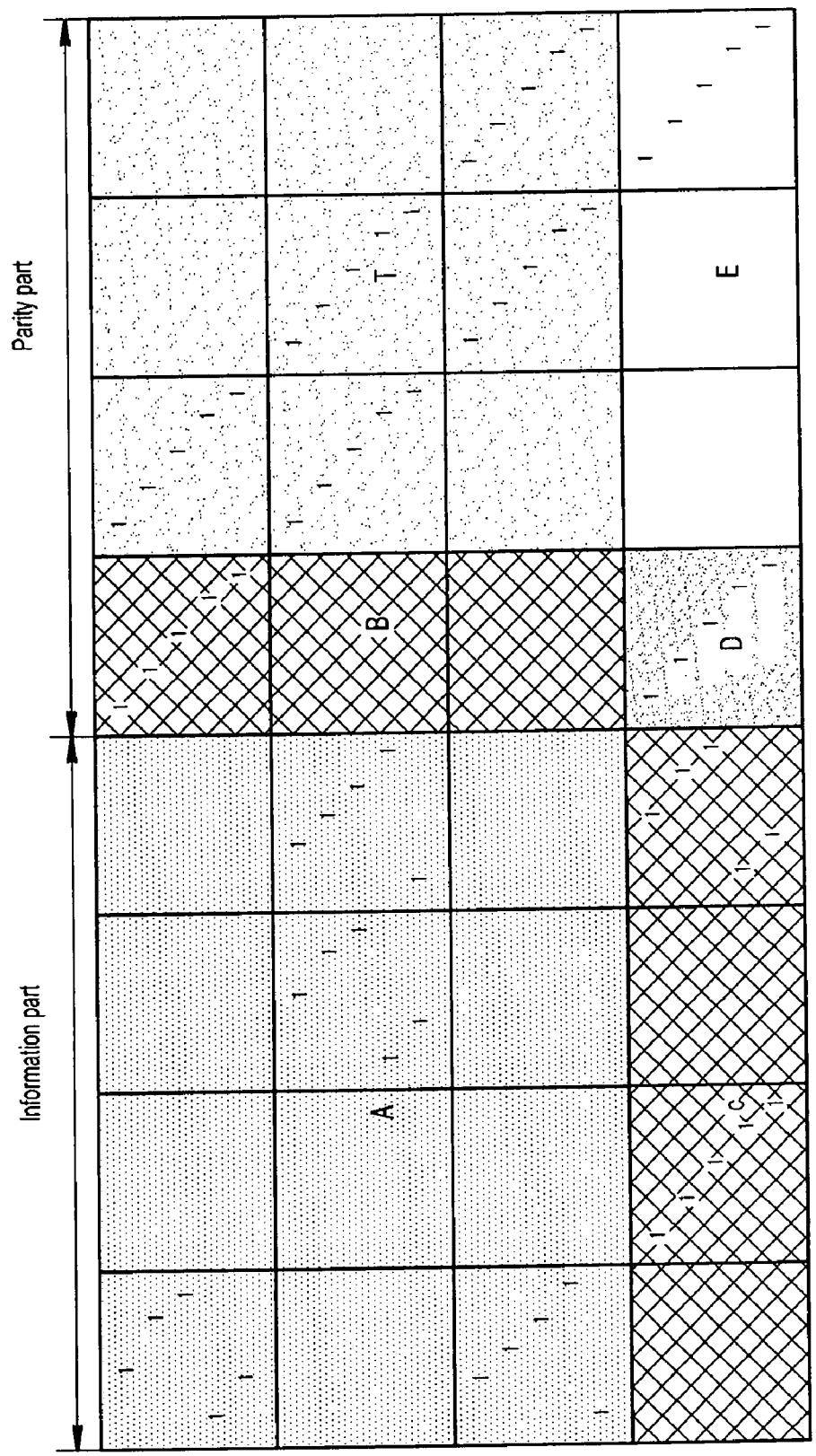
FIG. 7 is a diagram representing 6 partial blocks divided from the parity check matrix according to a structural characteristic of the block LDPC code.

As shown in FIG. 8, when the shift weight values of the parity check matrix is provided, the shift weight values are classified for the 6 respective partial blocks (i.e., the partial blocks A and C corresponding to the information part, the partial blocks C and D corresponding to the first parity part, and the partial blocks T and E corresponding to the second parity part) as shown in FIG. 7.

In addition, only the shift weight values corresponding to the partial blocks A, B, and C are stored in a memory, and among these shift weight values, the shift weight that is not −1 and the location information of the corresponding shift weight are stored for each partial block. The shift weight having a value of −1 is the zero matrix, a result value is 0 when matrix multiplication is performed, and therefore the shift weight having the value of −1 may be omitted from calculation.

Figures 10, 11:
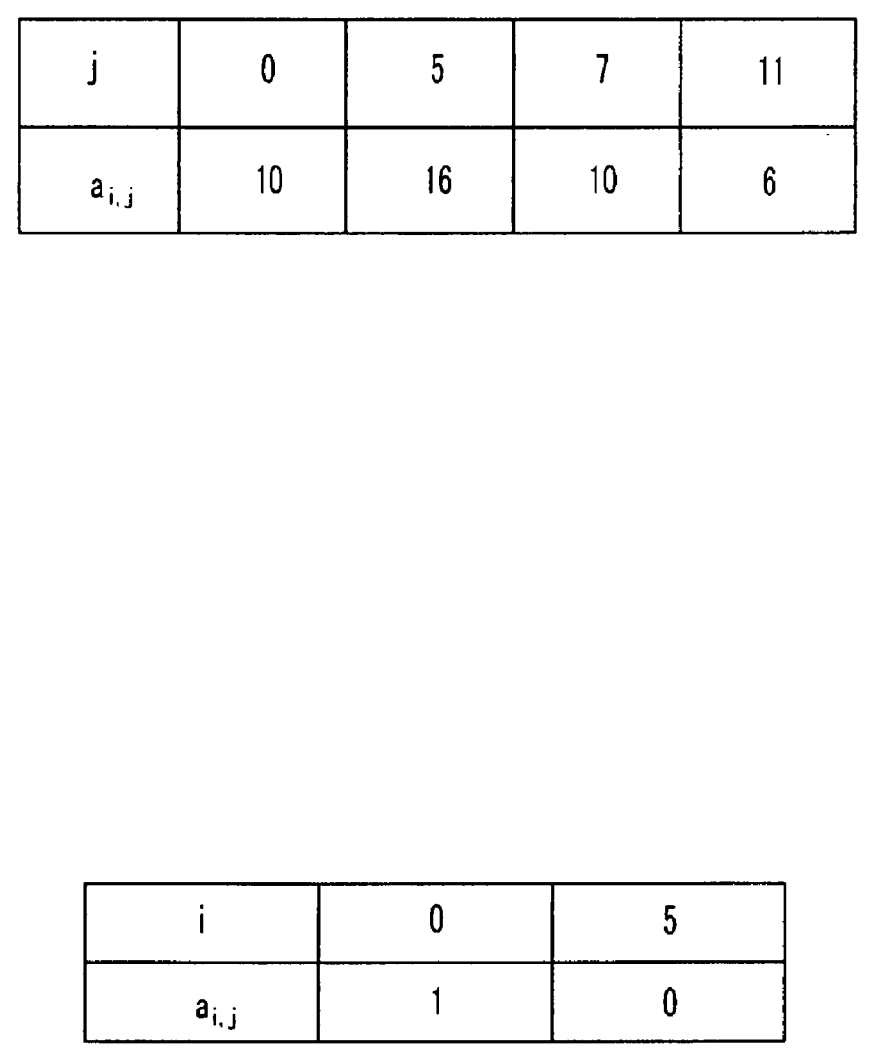

FIG. 9 is a diagram representing an example of the shift weight corresponding to the partial block A that is stored in a memory according to the exemplary embodiment of the present invention, FIG. 10 is a diagram representing an example of the shift weight corresponding to the partial block C that is stored in a memory according to the exemplary embodiment of the present invention, and FIG. 11 is a diagram representing an example of the shift weight corresponding to the partial block B that is stored in a memory according to the exemplary embodiment of the present invention.

As described, only the shift weight values corresponding to the partial blocks A, C, and B are stored in the memory since the structural characteristic of the block LDPC code includes the partial blocks D, E, and T, and characteristics of the partial blocks D, E, and T are included in the block LDPC encoding device in a manufacturing process.

Figure 12:
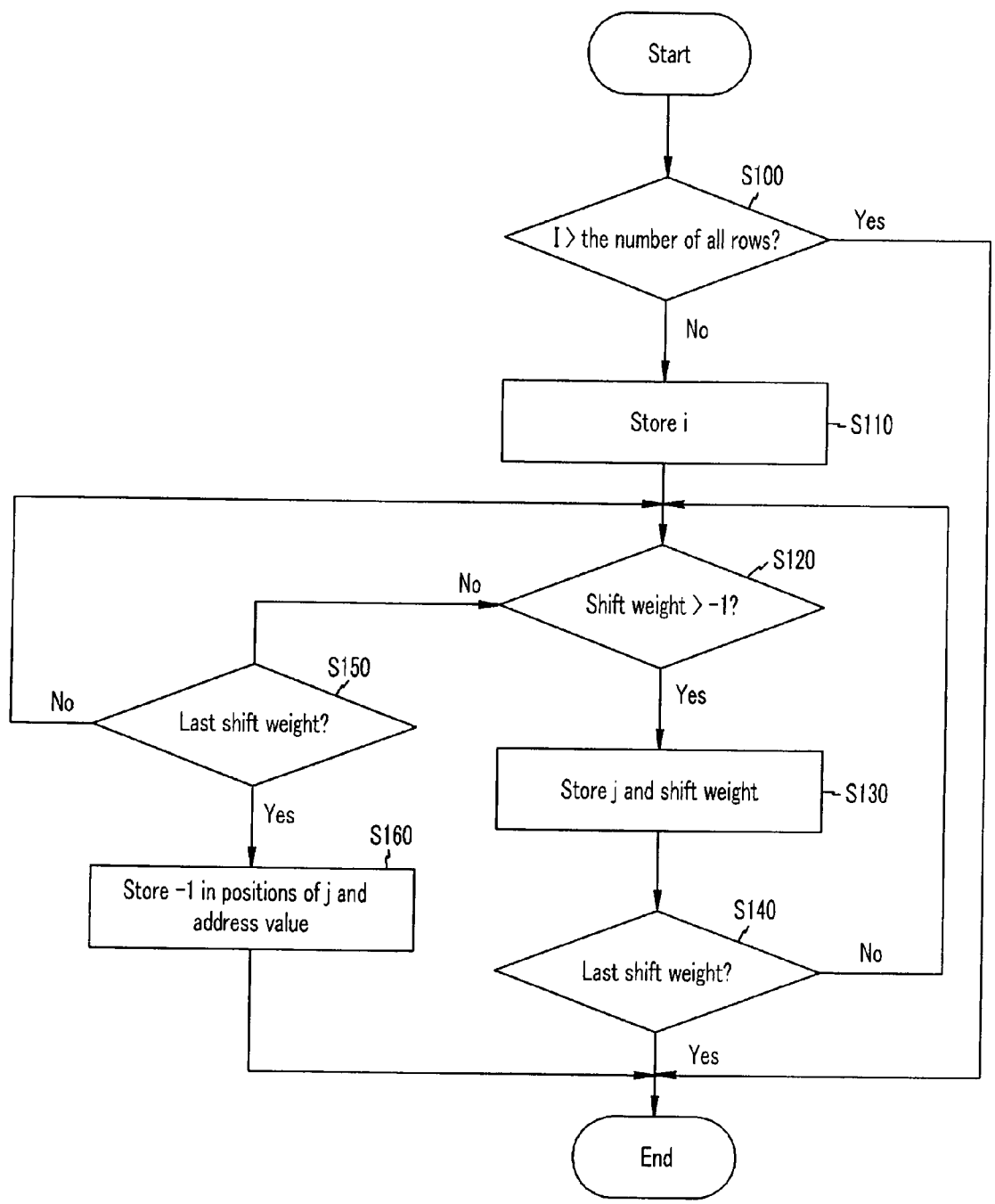
FIG. 12 is a diagram representing an example in which a transmitter stores the shift weight corresponding to the partial block A in the memory according to the exemplary embodiment of the present invention.

FIG. 12 is a diagram representing an example in which a transmitter stores the shift weight corresponding to the partial block A in the memory according to the exemplary embodiment of the present invention.

Referring to FIG. 9 and FIG. 12, the shift weights of the partial block A are sequentially read for each row to be stored in the memory. In this case, before storing the shift weights for each row, each row number i is stored in step S110. Subsequently, a shift weight column number j and a corresponding shift weight value are sequentially stored according to a column sequence in step S130 when the shift weight is greater than −1 (i.e., when the corresponding information unit block is not the zero matrix) in step S120, and the shift weight column number j and the corresponding shift weight value are not stored when the shift weight is −1. The operations (steps S120 and S130) are repeatedly performed for all the shift weights in each row in step S140.

In addition, when the shift weight is −1, the value of −1 is stored rather than the column number and the shift weight to express the end of the row in step S160 when the shift weight is the last shift weight in step S150 for each row of the partial block A.

The above operations are repeatedly performed until all the shift weight data of each row of the partial block A are evaluated, in step S100.

In addition, a shown in FIG. 10 and FIG. 11, the location information of the shift weight is expressed only by the column number j in the partial block C since the partial block C is formed by one row, and the location information of the shift weight is expressed only by the row number i in the partial block B since the partial block B is formed by one column. In this case, the location information and the shift weight are stored in the memory only for the shift weight that is greater than −1.

When the parity check matrix of the block LDPC code is stored as described above, the shift weights corresponding to the partial blocks A, B, and C are stored to be used without storing all of the parity check matrix, the location information of the shift weight of the information unit block that is not the zero matrix and the shift weight value are stored in the memory, the number of memories required to store the parity check matrix when the encoding device is formed is considerably reduced, and therefore the manufacturing cost of the encoding device may be reduced.

A block LDPC encoding method according to the exemplary embodiment of the present invention will now be described with reference to the figures.

Figure 13:
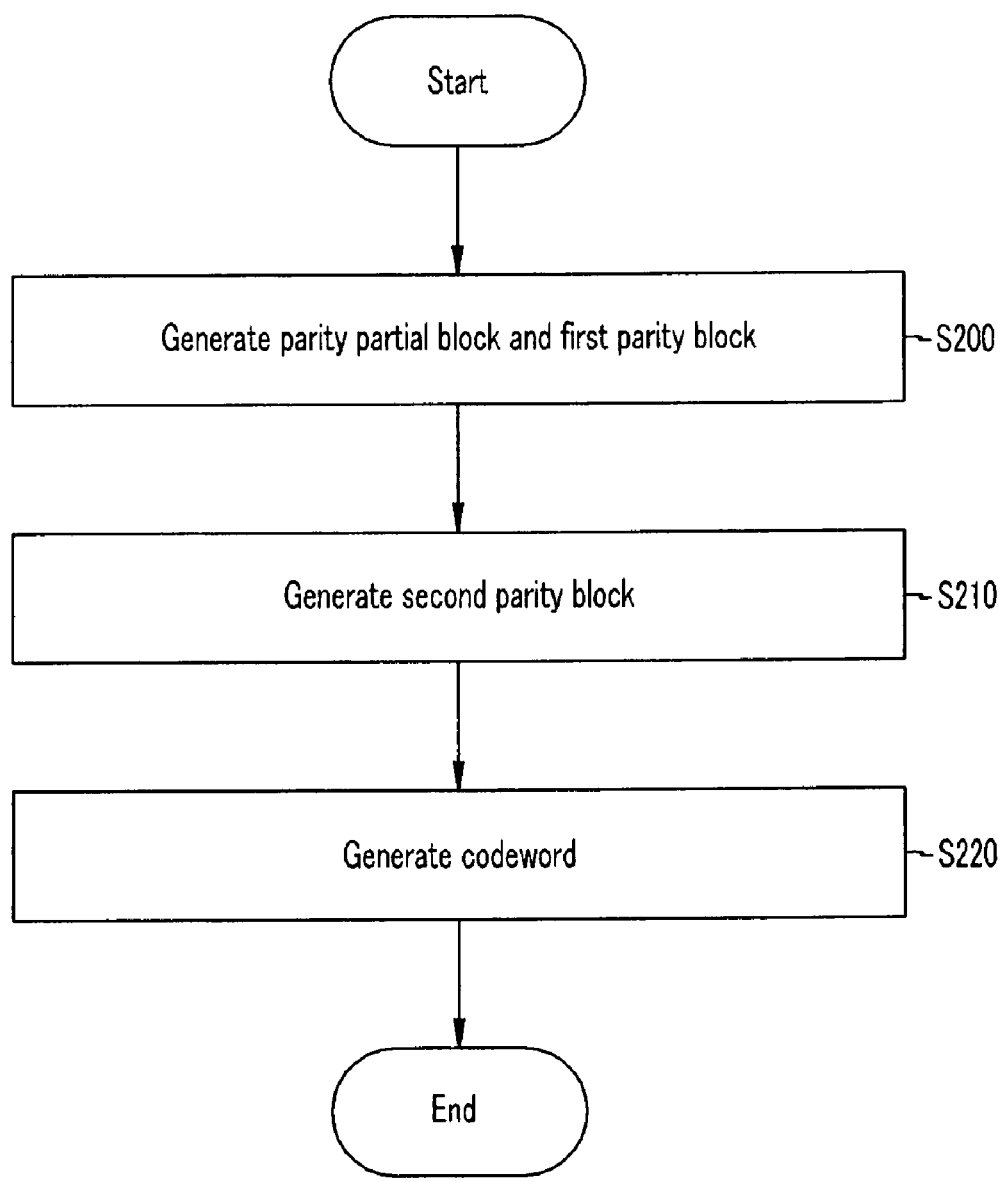
FIG. 13 is a flowchart for representing an encoding method of a block LDPC encoding device according to the exemplary embodiment of the present invention.

FIG. 13 is a flowchart for representing the encoding method of the block LDPC encoding device according to the exemplary embodiment of the present invention.

Referring to FIG. 13, when an information word vector corresponding to the location information of the information block u is input, the encoding device uses the shift weights of the partial blocks A and C corresponding to the information part of the parity check matrix to generate at least one parity partial block in which resulting values obtained by cyclically shifting the information block are accumulatively added for each row of the partial block A and a first parity block p1 in which all the resulting values are added, in step S200. In this case, the information block is cyclically shifted for each information unit block, and an exclusive OR is used to add the resulting values obtained by cyclically shifting the information block for each information unit block.

When the parity partial block and the first parity block p1 are generated, the cyclic shift operation is performed by using the first parity block p1 and the weight of the partial block B, and a result of the cyclic shift operation and parity partial blocks are added and sequentially arranged to generate a second parity block p2 in step S210.

Subsequently, the encoding device combines the information block u, the first parity block p1, and the second parity block p2 to generate a codeword in step S220. In this case, the information block u, the first parity block p1, and the second parity block p2 are sequentially combined to be the codeword.

Figure 14:
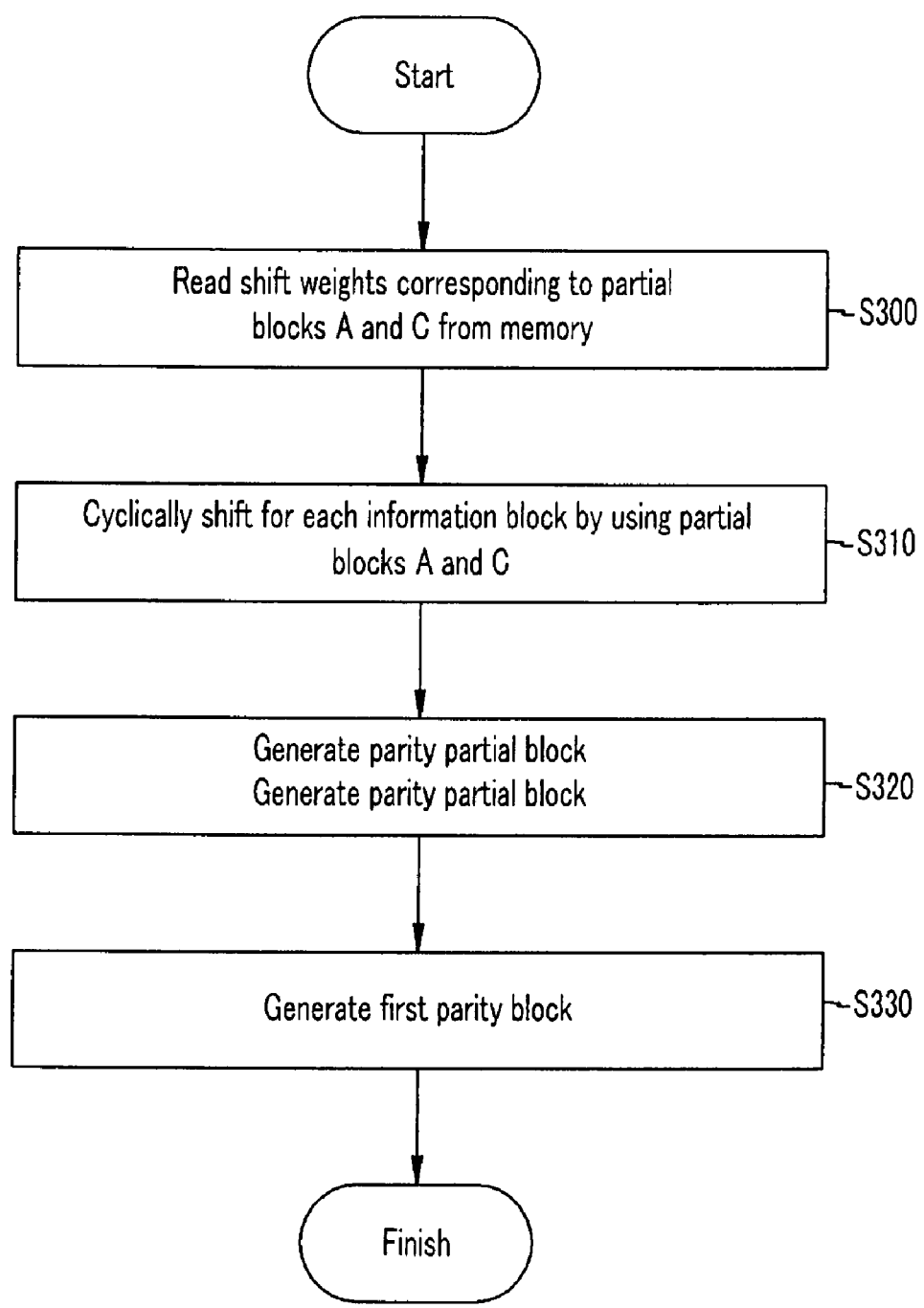
FIG. 14 is a flowchart representing a process for generating the first parity block in a block LDPC encoding process according to the exemplary embodiment of the present invention.

FIG. 14 is a flowchart representing a process for generating the first parity block in a block LDPC encoding process according to the exemplary embodiment of the present invention.

When the information word vector to be encoded is input to the encoding device, the information block u is read by using the information word vector, and the location information and the shift weight corresponding to the partial blocks A and C are read from the memory in step S300.

Subsequently, the information block u is cyclically shifted in step S310 by using the shift weights of the partial blocks A and C read from the memory. In this case, the cyclic shift operation is performed for each information unit block such that the information unit block is cyclically shifted by the corresponding shift weight.

When the cyclic shift operation is performed for all the information unit blocks, a result of the cyclic shift result for each information unit block is accumulatively added in correspondence to each row of the partial block A to generate at least one parity partial block in step S320. In this case, the exclusive OR is used, and the number of generated parity partial blocks is the same as the number of rows of the partial block A. The above generated parity partial block is used to generate the second parity block.

The encoding device adds all the cyclic shift results of the information block to generate the first parity block in step S330. In this case, since the accumulative adding is performed in the above parity partial block generation process, the first parity partial block is generated when the cyclic shift result corresponding to the partial block C is added to the parity partial block corresponding to the last row of the partial block A.

In addition, the cyclic shift operation according to the exemplary embodiment of the present invention may be performed in parallel in correspondence to each row of the partial block A and the partial block C, and the accumulative adding operation may be performed in parallel. Accordingly, a time delay in an encoding process may be reduced, and a high speed encoding process may be performed.

Figure 15:
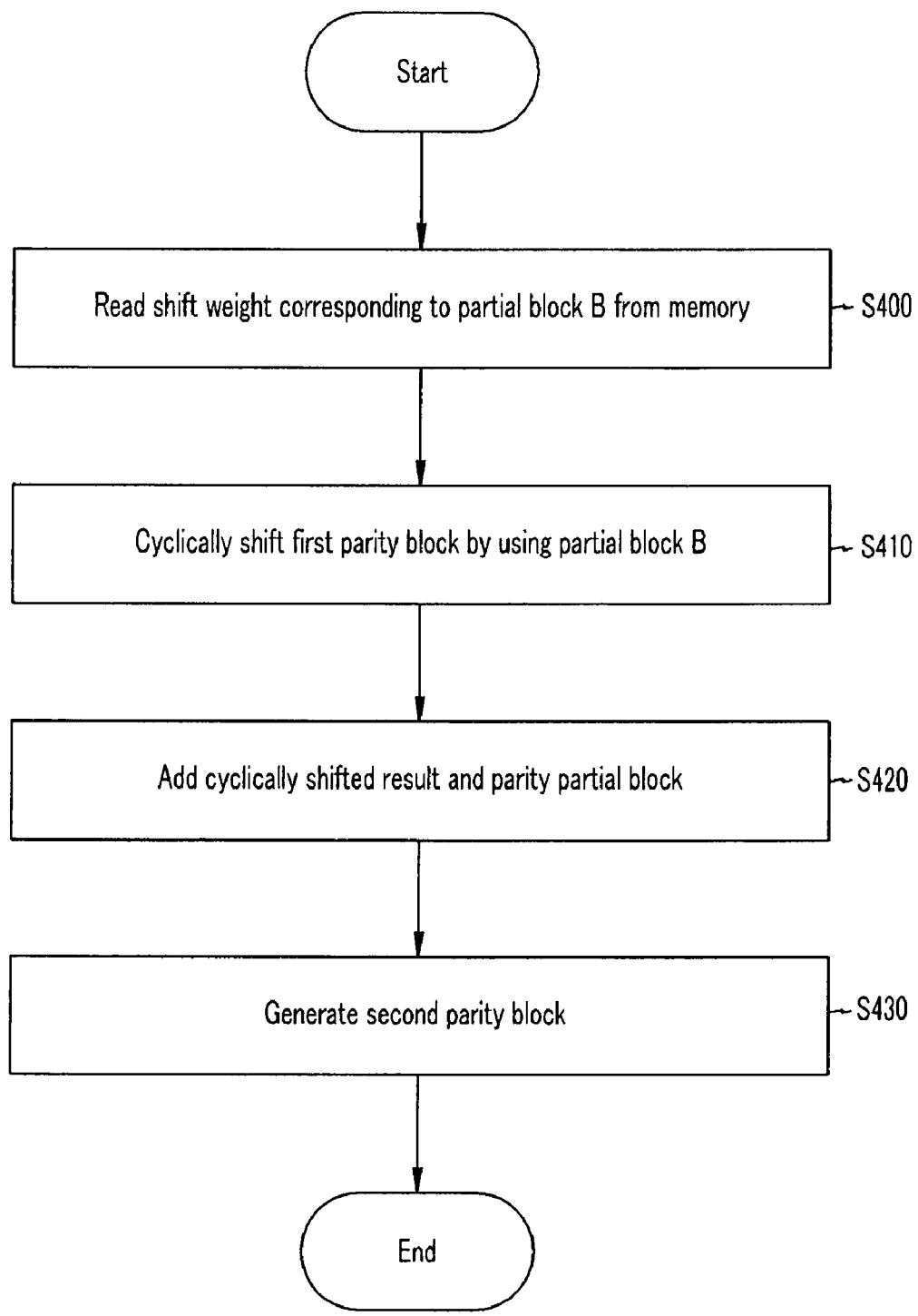
FIG. 15 is a flowchart representing a process for generating the second parity block in the block LDPC encoding process according to the exemplary embodiment of the present invention.

FIG. 15 is a flowchart representing a process for generating the second parity block in the block LDPC encoding process according to the exemplary embodiment of the present invention.

As shown in FIG. 14, at least one parity partial block is generated in step S320 as described above. The parity partial blocks are sequentially arranged. That is, the generated second parity block corresponds to a length obtained by arranging all the parity partial blocks.

The encoding device reads the shift weight corresponding to the partial block B from the memory in step S400. Subsequently, the first parity block is cyclically shifted by using the read shift weight of the partial block B in step S410. The results of the cyclic shift operation are added from a corresponding position to the end of the parity partial block to generate the second parity block in step S430.

The codeword is output while the information block, the generated first parity block, and the second parity block are sequentially arranged.

When the first parity block and the second parity block are generated as described above, a time for generating the first parity block is reduced since independent operations are performed in parallel, the result of the first parity block generation process is used to generate the second parity block, the first and second parity blocks are almost simultaneously generated, and therefore a time delay between the first parity block and the second parity block may be reduced.

Figure 16:
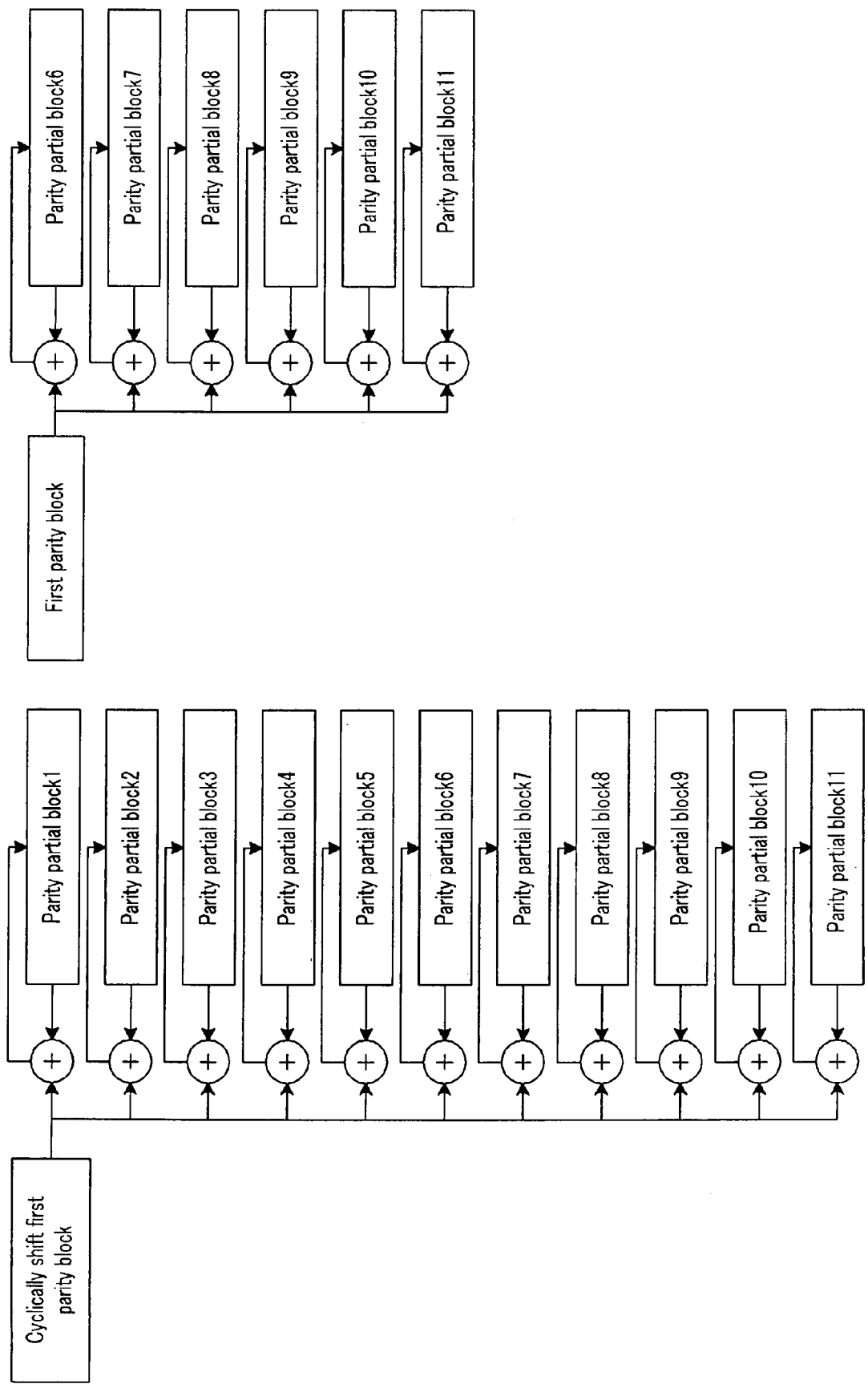
FIG. 16 is a diagram representing a method for adding a cyclic shift result of the first parity block to the respective parity partial blocks by using the parity check matrix shown in FIG. 8.

FIG. 16 is a diagram representing a method for adding the cyclic shift result of the first parity block to the respective parity partial blocks by using the parity check matrix shown in FIG. 8. In the partial block B, only two values are values that are not −1 according to a characteristic of the variable length block LDPC code.

The two values are positioned at first and last parts of the partial block B. That is, the first and sixth parts of the partial block B have shift weight values that are not −1 shown in FIG. 9.

As shown in FIG. 16, the first parity block is cyclically shifted by the shift weight of the partial block B to be added to the parity partial block corresponding to the corresponding shift weight position to the last parity partial block. That is, when the partial block b shown in FIG. 8 is used, a value obtained by cyclically shifting the first parity block by 1 is added to a first parity partial block to the last parity partial block, and the first parity block is added to a sixth parity partial block to the last parity partial block.

The added results are sequentially arranged to generate the second parity block.

Since an encoding method using the result of the first parity block calculation process without additional calculation for generating the second parity block is used, complexity of the encoding device may be reduced, and calculation time may also be reduced.

Figure 17:
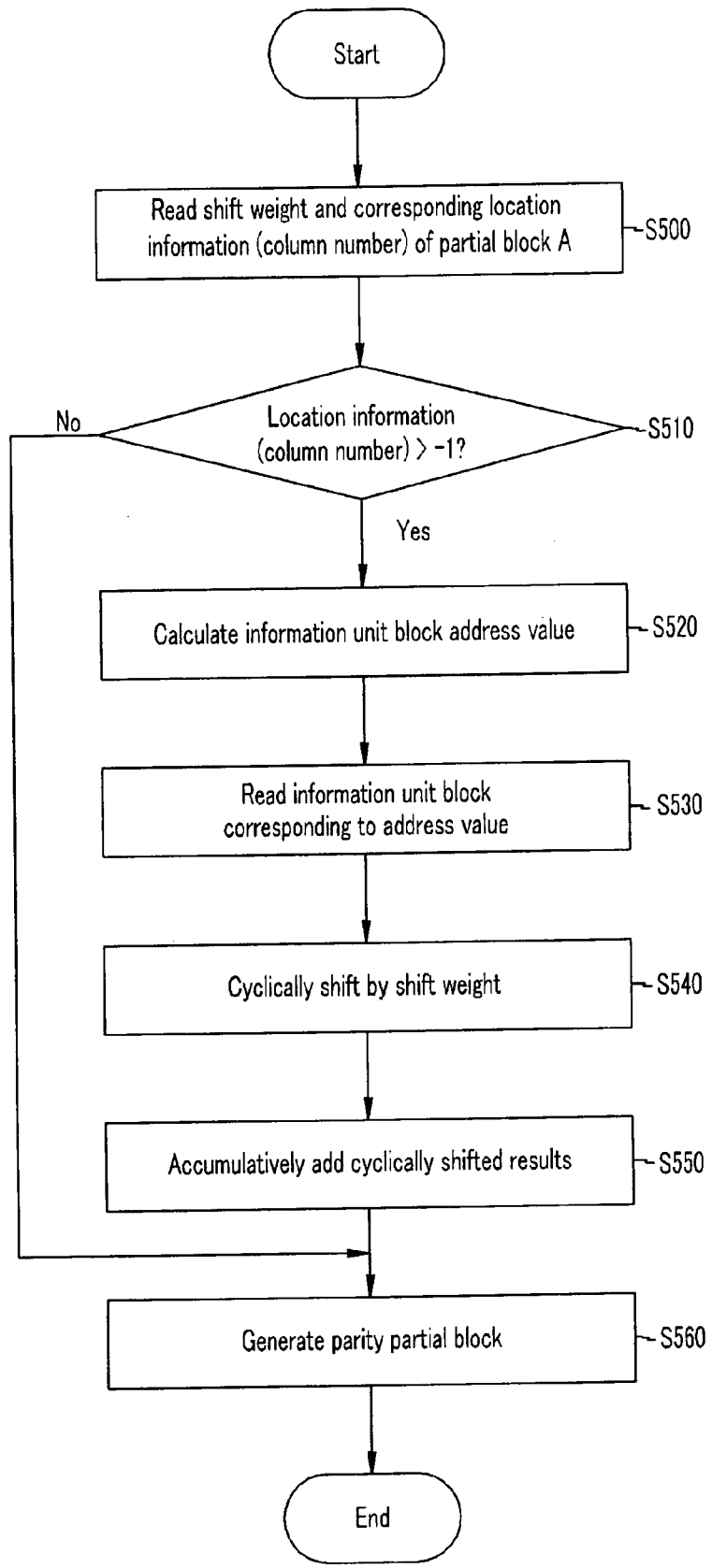
FIG. 17 is a flowchart representing a method for generating the parity partial block according to the exemplary embodiment of the present invention.

FIG. 17 is a flowchart representing a method for generating the parity partial block according to the exemplary embodiment of the present invention.

The cyclic shift operation in the first parity block generation process is not performed for all the information blocks u. That is, results are 0 when the zero matrix having the shift weight that is not −1 is calculated by using matrix multiplication to the information unit block of the information block, which the cyclic shift operation in the first parity block generation process may be omitted in a process for adding the cyclically shifted result. Therefore, the shift weight of −1 is not stored in the memory when the shift weights are stored in the memory as described.

That is, when the location information and the shift weight stored as shown in FIG. 9 are used, the cyclic shift operation may be performed by reading the information unit block corresponding to a position having the shift weight that is not −1 in the cyclic shift operation for each row of the partial block A. In this case, the information unit block is the information block u divided by a predetermined size (i.e. a z unit), and the cyclic shift operation is performed for each information unit block.

It is required to add all the results that are cyclically shifted for each information unit block in correspondence to the shift weight of the corresponding row of the partial block A to generate one parity partial block.

Firstly, the location information and the shift weight of the corresponding row of the partial block A are sequentially read from the memory in step S500. In this case, when the sequentially read location information is −1 in step S510, it is the end of the row, and therefore a result parity block is generated in step S560.

In addition, when the location information and the shift weight are read, an address of the corresponding information unit block is calculated by using the corresponding location information j in steps S520. The address of the information unit block may be given as Equation 8.

$$\text{information unit block start address} = j \times z$$

$$\text{information unit block end address} = +1) \times z - 1 \quad \text{[Equation 8]}$$

Here, z denotes a size of the information unit block, and j denotes a column number among the location information of the partial block A read from the memory.

When the address of the information unit block is calculated, the information unit block corresponding to the address is read in step S530, and the information unit block is cyclically shifted by the corresponding shift weight in step S540. The cyclically shifted result is added to the accumulatively added cyclic shift result in step S550.

In addition, when the cyclic shift operation is finished for the corresponding row, the accumulative added cyclic shift result is output to the corresponding parity partial block in step S560.

In this case, when the cyclic shift operation for the shift weight that is not −1 is performed, the accumulatively added cyclic shift result is the zero matrix if the shift weight is −1, and a product of the zero matrix and the information unit block is also the zero matrix.

Since the location information of each shift weight is separately stored when the parity partial block is generated as described above and the cyclic shift operation of the information unit block corresponding to each shift weight is independently performed, the time for performing an encoding operation may be reduced.

In addition, since all the shift weights are not stored as the shift weights that are not −1 are stored, the number of memories is considerably reduced according to characteristics of the parity check matrix having the shift weight of −1.

The block LDPC encoding device according to the exemplary embodiment of the present invention will now be described with reference to the figures.

Figure 18:
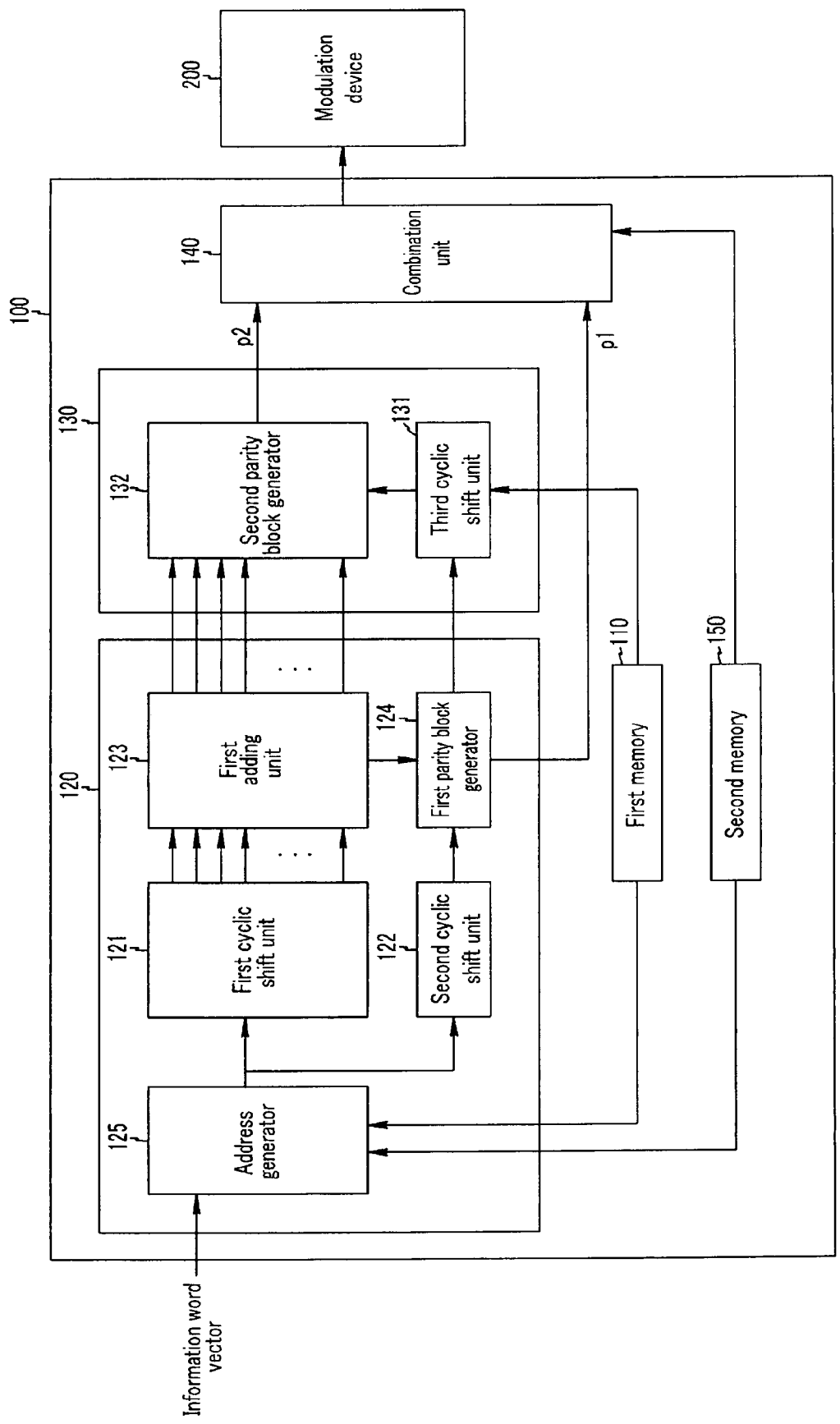
FIG. 18 is a schematic diagram of a block LDPC encoding device according to the exemplary embodiment of the present invention.

FIG. 18 is a schematic diagram of a block LDPC encoding device 100 according to the exemplary embodiment of the present invention.

Referring to FIG. 18, the block LDPC encoding device 100 includes a first memory 110, a first encoder 120, a second encoder 130, a combination unit 140, and a second memory 150.

The first memory 110 stores the shift weight value of the parity check matrix of the block LDPC code. The parity check matrix may be classified into 6 partial blocks as described above, and the first memory 110 stores the shift weights of the partial blocks A, C, and B among the 6 partial blocks.

The second memory 150 stores the information block u while classifying the information block u for each information unit block.

Figure 19:
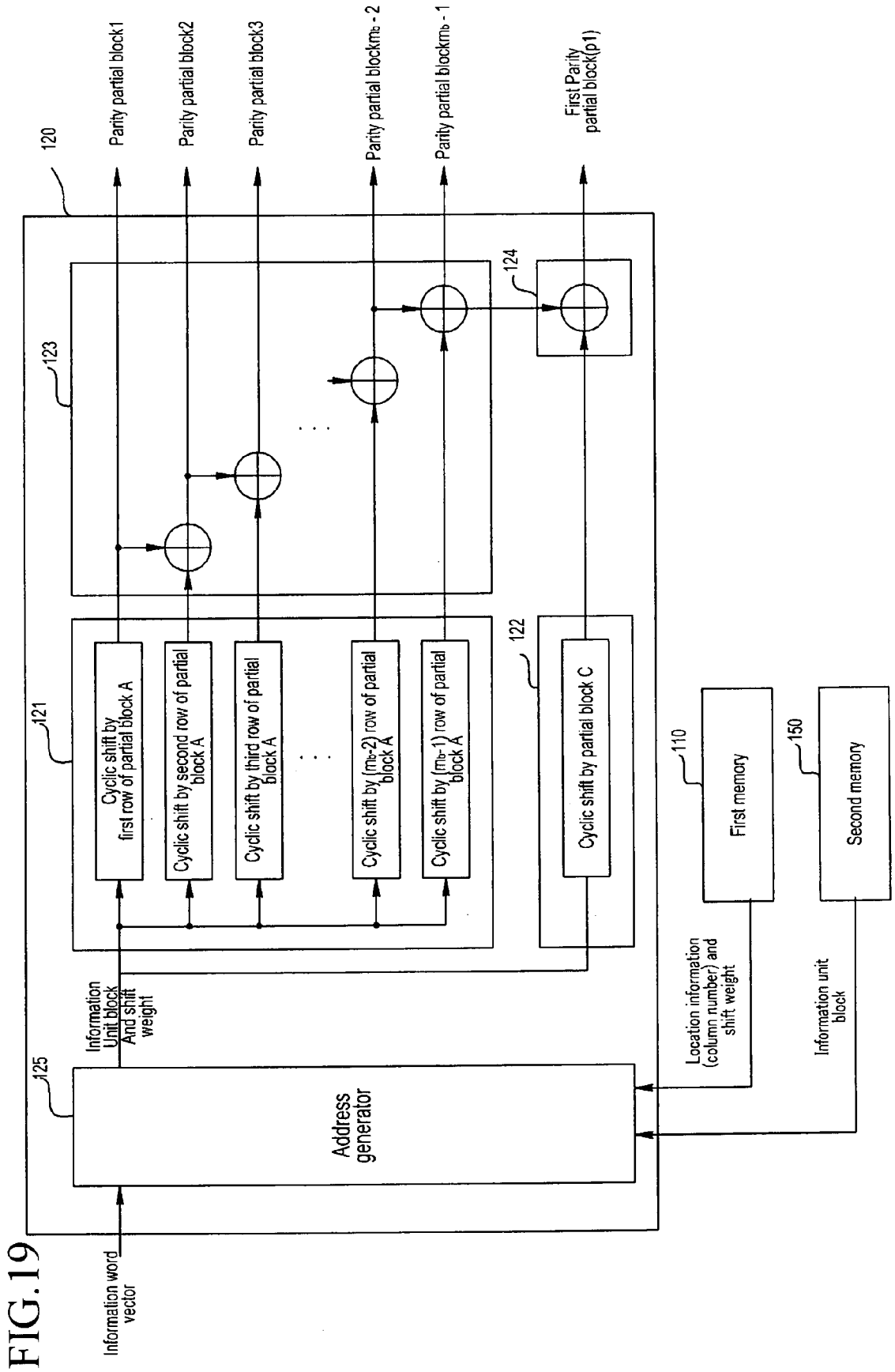
FIG. 19 is a diagram of a signal flow in a process for generating the parity partial block and the first parity block by a first encoder.

The first encoder 120 includes a first cyclic shift unit 121, a second cyclic shift unit 122, a first adding unit 123, a first parity block generator 124, and an address generator 125. When the information word vector corresponding to the position of the information block is input, the information unit blocks of the information block corresponding to the information word vector is cyclically shifted by using the shift weight of the partial blocks A and C, and the parity partial blocks and the first parity block p1 are output. FIG. 19 is a diagram of a signal flow in a process for generating the parity partial block and the first parity block by the first encoder 120.

The address generator 125 reads the location information (i.e., the column number) of the shift weight of the partial blocks A and C and the shift weight from the first memory 110 and outputs them, and reads the information unit block corresponding to the location information from the second memory 150 and outputs it.

The first cyclic shift unit 121 uses the information unit block and the shift weight of the partial block A input from the address generator 125 to cyclically shift the information unit block, and outputs it. In this case, since the cyclic shift operations performed for the respective rows of the partial block A may be independently performed, the cyclic shift operations may be simultaneously performed.

The second cyclic shift unit 122 uses the information unit block and the shift weight of the partial block C input from the address generator 125 to cyclically shift the information unit block, and outputs it, which is independently performed from the cyclic shift operation corresponding to each row of the partial block A, and therefore the operations are simultaneously performed.

The first adding unit 123 accumulatively adds the cyclic shift value input from the first cyclic shift unit 121. That is, the cyclically shifted results for each row of the partial block A are accumulatively added and the results are added to an accumulative adding result of a previous row, and therefore at least one parity partial block is output. In this case, the exclusive OR is used for the adding operation, and all the parity partial blocks are initialized to be 0 in an initialization process, which is not illustrated in the figure.

The first parity block generator 124 adds the last parity partial block (i.e., the accumulatively added result of all the cyclic shift results corresponding to the partial block A) output from the first adding unit 123 to the accumulatively added result of the cyclic shift results output from the second cyclic shift unit 122 to calculate the first parity block p1, and outputs the first parity block p1.

The second encoder 130 includes a third cyclic shift unit 131 and a second parity block generator 132. When the parity partial blocks and the first parity block are output from the first encoder 120, the second encoder 130 reads them to generate the second parity block and outputs it.

That is, the third cyclic shift unit 131 receives the first parity block from the first encoder 120 and performs the cyclic shift operation by the shift weight of the partial block B read from the first memory. The second parity block generator 132 calculates an exclusive OR of the shift result of the first parity block output from the third cyclic shift unit 131 and the parity partial blocks read from the second encoder 130, arranges them according to the sequence of the parity partial block, and the second parity block p2 is output.

The combination unit 140 combines the information unit blocks, the first parity block, and the second parity block read from the second memory 150 according to the information word vector to generate the block LDPC codeword, and outputs it. Subsequently, the codeword is transmitted to a modulation device 200, and is modulated to be transmitted.

The second memory 150 stores the information block for each information unit block.

When the block LDPC encoding is performed as described, a matrix multiplication corresponding to $ET^{-1}$ and $T^{-1}$ in the parity block generation process is eliminated, the characteristic of the block LDPC encoding is used, the matrix multiplication is substituted by the cyclic shift operation and the exclusive OR, and therefore the complexity in the encoding process may be reduced. In addition, the number of memories required to store the parity check matrix may be reduced.

Further, since the cyclic shift operation of the information unit block and the accumulative adding operation are performed in parallel, and the information unit blocks corresponding to the shift weights that are not −1 are cyclically shifted, the complexity may be improved and the time delay in the encoding process may be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

According to the exemplary embodiment of the present invention, a matrix multiplication corresponding to $ET^{-1}$ and $T^{-1}$ in the parity block generation process is eliminated, the characteristic of the block LDPC encoding is used, the matrix multiplication is substituted by the cyclic shift operation and the exclusive OR, and therefore the complexity in the encoding process may be reduced. In addition, the number of memories required to store the parity check matrix may be reduced.

Further, since the cyclic shift operation of the information unit block and the accumulative adding operation are performed in parallel, and the information unit blocks corresponding to the shift weights that are not −1 are cyclically shifted, the complexity may be improved and the time delay in the encoding process may be reduced.

What is claimed is:

1. A block low density parity check encoding method comprising:
    cyclically shifting an information unit block included in an information block by using partial blocks A and C that are divided from a parity check matrix according to a structural characteristic of a block low density parity check code;
    accumulatively adding the cyclically shifting results to generate at least one parity partial block corresponding to the partial block A and a first parity block corresponding to the partial blocks A and C;
    adding a cyclically shifting result of the first parity block to the parity partial block in correspondence to a shift weight of a partial block B, and generating a second parity block by arranging the added results; and
    combining the information block, the first parity block, and the second parity block to generate a codeword.

2. The block low density parity check encoding method of claim 1,
    further comprising storing a shift weight of the parity check matrix in a memory before cyclically shifting the information unit block,
    wherein the storing the shift weight of the parity check matrix in the memory comprises:
        generating the parity check matrix according to an encoding rate;
        expressing the parity check matrix as a shift weight matrix;
        classifying the shift weight matrix as at least one partial block; and
        storing location information of shift weights corresponding to the partial blocks A, B, and C among shift weights corresponding to an unitary matrix that is not a zero matrix in the shift weight matrix and the shift weights.

3. The block low density parity check encoding method of claim 1,
    wherein the cyclically shifting of the information unit block comprises reading shift weights of the partial blocks A and C and cyclically shifting the information unit block according to the shift weights of the partial blocks A and C, and
    the generating of the parity partial block and the first parity partial block comprises accumulatively adding cyclic shift results for each row of the partial block A to generate the parity partial block and adding cyclic shift results of the information unit block according to the shift weights of the partial blocks A and C to generate the first parity block.

4. The block low density parity check encoding method of claim 3,
wherein the reading of the shift weight comprises reading location information corresponding to the shift weight, and
the cyclically shifting of the information unit block comprises cyclically shifting the information unit block corresponding to the location information by using the shift weight.

5. The block low density parity check encoding method of claim 3, wherein, in the generating of the parity partial block, a shift weight and location information of a row corresponding to the parity partial block among the rows of the partial blocks A are used, the cyclic shift results of the information unit blocks corresponding to the location information are accumulatively added, cyclic shift results up to a row before the row corresponding to the parity partial block are added to a value obtained by accumulatively adding, and therefore the parity partial block is generated.

6. The block low density parity check encoding method of claim 3, further comprising:
reading of the shift weight of the partial block B;
cyclically shifting the first parity block according to the shift weight of the partial block B;
adding cyclic shift results of the parity partial block and the first parity block; and
arranging adding results of the cyclic shift results and generating a second parity block.

7. The block low density parity check encoding method of claim 3, wherein an exclusive OR is used in a block low density parity check encoding process.

8. The block low density parity check encoding method of claim 6, wherein an arrangement order of the added results of the cyclic shift results of the parity partial block and the first parity block corresponds to an order of the parity partial block.

9. A block low density parity check encoding device comprising:
a first memory for classifying shift weights of a parity check matrix of a block low density parity check code for each of partial blocks that are divided from the parity check matrix according to structural characteristics of the block low density parity check code, and storing the shift weights;
a first encoder for cyclically shifting and accumulatively adding information unit blocks by using shift weights of partial blocks A and C read from the first memory and outputting at least one parity partial block and a first parity block, the information unit block formed by dividing an information block into predetermined sizes;
a second encoder for adding and arranging cyclic shift results of the first parity block and the parity partial block by using a shift weight corresponding to a partial block B read from the first memory, and outputting a second parity block; and
a combination unit for combining the information unit block, the first parity block received from the first encoder, and the second parity block received from the second encoder, and outputting a codeword.

10. The block low density parity check encoding device of claim 9,
further comprising a second memory for dividing the information block into the information unit blocks and storing the information unit blocks,
wherein the first encoder uses the information unit block read from the second memory to generate the parity partial block and the first parity block.

11. The block low density parity check encoding device of claim 9, wherein the first encoder comprises:
a first cyclic shift unit for outputting a result obtained by cyclically shifting the information unit block by using the shift weight of the partial block A;
a second cyclic shift weight unit for outputting a result obtained by cyclically shifting the information unit block by using the shift weight of the partial block C;
a first adding unit for outputting the parity partial block generated by accumulatively adding the result output from the first cyclic shift unit for each row of the partial block; and
a first parity block generator for adding the parity partial block corresponding to an added result of the results output from the first cyclic shift unit to the result output from the second cyclic shift unit and outputting the first parity block.

12. The block low density parity check encoding device of claim 11, wherein:
the first memory stores location information corresponding to the shift weight;
the first encoder comprises an address generator for reading the location information corresponding to the shift weight to be used to perform a cyclic shift operation from the first memory, and reading and outputting the information unit block according to the location information from the second memory; and
the first cyclic shift unit reads the information unit block output from the address generator and cyclically shifts the information unit block by the shift weight corresponding to the location information.

13. The block low density parity check encoding device of claim 11, wherein the second encoder comprises:
a third cyclic shift unit for outputting a result obtained by cyclically shifting the information unit block by using the shift weight of the partial block B; and
a second parity generator for outputting the second parity block obtained by adding and arranging the result output from the third cyclic shift unit and the parity partial block.

14. The block low density parity check encoding device of claim 11, wherein the first memory stores the shift weights except for the shift weights corresponding to a zero matrix among the shift weights corresponding to the partial blocks A, B, and C.

15. The block low density parity check encoding device of claim 11, wherein the first cyclic shift unit independently performs a cyclic shifting operation for each row of the partial block A, and the cyclic shift operation corresponding to each row of the partial block A is performed in parallel.

16. The block low density parity check encoding device of claim 15, wherein the second cyclic shift unit independently performs the cyclic shifting operation with respect to the cyclic shifting operation performed by the first cyclic shift unit, and performs the cyclic shifting operation in parallel to the cyclic shifting operation performed by the first cyclic shift unit.

* * * * *